(12) United States Patent
Yoo

(10) Patent No.: US 7,276,445 B2
(45) Date of Patent: Oct. 2, 2007

(54) METHOD FOR FORMING PATTERN USING PRINTING METHOD

(75) Inventor: Hong-Suk Yoo, Gyeonggi-Do (KR)

(73) Assignee: LG.Philips Co., Ltd., Seoul (KR)

( * ) Notice: Subject to any disclaimer, the term of this patent is extended or adjusted under 35 U.S.C. 154(b) by 131 days.

(21) Appl. No.: 11/114,095

(22) Filed: Apr. 26, 2005

(65) Prior Publication Data

US 2005/0245085 A1    Nov. 3, 2005

(30) Foreign Application Priority Data

Apr. 30, 2004    (KR)    ............... 10-2004-0030772

(51) Int. Cl.
*H01L 21/302* (2006.01)
(52) U.S. Cl. .............. 438/689; 216/41; 216/23; 438/689; 438/694; 438/30; 438/21; 438/743; 438/691; 438/700
(58) Field of Classification Search ............ 438/689; 216/41
See application file for complete search history.

(56) References Cited

U.S. PATENT DOCUMENTS 6,375,870 B1 * 4/2002 Visovsky et al. ......... 264/1.31

2005/0243233 A1 * 11/2005 Kim ........................ 349/43

FOREIGN PATENT DOCUMENTS

| JP | 2002-280711 | 9/2002 |
|----|-------------|--------|
| JP | 2003-82469  | 3/2003 |

* cited by examiner

*Primary Examiner*—Nadine Norton
*Assistant Examiner*—Patricia A. George
(74) *Attorney, Agent, or Firm*—McKenna Long & Aldridge LLP

(57) ABSTRACT

A method for forming a pattern is provided that includes: providing a cliché having a plurality of convex patterns; applying an adhesive force reinforcing agent onto each surface of the convex patterns; forming an etching object layer on a substrate and then applying ink onto an upper portion of the etching object layer; attaching the cliché and the substrate to each other such that the convex patterns onto which the adhesive force reinforcing agent is applied can come in contact with the ink applied onto the etching object layer; and forming ink patterns which selectively remain on the etching object layer by separating the substrate and the cliché from each other.

13 Claims, 6 Drawing Sheets

METHOD FOR FORMING PATTERN USING PRINTING METHOD

This application claims the benefit of Korean Patent Application No. 30772, filed on Apr. 30, 2004, which is hereby incorporated by reference for all purposes as if fully set forth herein.

BACKGROUND OF THE INVENTION

1. Field of the Invention

The present invention relates to a printing method for forming a pattern in a liquid crystal display panel, and more particularly, to a method for forming a pattern with uniform thickness on a substrate.

2. Description of the Related Art

A display device, especially, a flat panel display such as a liquid crystal display (LCD) device is driven by an active device such as a thin film transistor provided at each pixel. The driving method is referred as an active matrix driving method. According to the active matrix driving method, the active device is arranged at each pixel to drive the corresponding pixel.

FIG. 1 is a view illustrating an active matrix type LCD device. The LCD device is a TFT LCD device in which a thin film transistor is used as the active device. As illustrated, at each pixel of the TFT LCD device, wherein N×M pixels are arranged horizontally and vertically, a TFT formed at a gate line 4 to which a scan signal is applied from an external driving circuit and a data line 6 to which an image signal is applied is provided. The TFT includes a gate electrode 3 connected to the gate line 4, a semiconductor layer 8 formed on the gate electrode 3 and activated as a scan signal is applied to the gate electrode 3, and a source/drain electrode 5 formed on the semiconductor layer 8. A pixel electrode 10 is formed in a display region of the pixel 1. The pixel electrode 10 is connected to the source/drain electrode 5 and operates liquid crystal (not illustrated) by receiving an image signal through the source/drain electrode 5 as the semiconductor layer 8 is activated.

FIG. 2 is a view illustrating the structure of the TFT arranged at each pixel. As illustrated, the TFT includes a substrate 20 formed of a transparent insulating material such as glass, a gate electrode 3 formed on the substrate 20, a gate insulating layer 22 formed on the entire surface of the substrate 20, a semiconductor layer 8 formed on the gate insulating layer 22 and activated as a signal is applied to the gate electrode 3, a source/drain electrode 5 formed on the semiconductor layer, and a passivation layer 25 formed on the source/drain electrode 5 for protecting the device.

The source/drain electrode 5 of the TFT is electrically connected to a pixel electrode formed in the pixel region, and displays an image by driving liquid crystal as a signal is applied to the pixel electrode through the source/drain electrode 5.

In the active matrix type LCD device, each pixel has a size corresponding to several tens of μm. Accordingly, the active device such as the TFT arranged in the pixel has to be formed to have a minute size corresponding to several μm. Moreover, as the consumer's demand for a display device of a high image quality such as an HDTV is being increased, more pixels have to be arranged on a screen of the same area. Accordingly, an active device pattern arranged in each pixel (including a gate line pattern and a data line pattern) has to be also formed to have a minute size.

In order to fabricate an active device such as a TFT according to the related art, a pattern, a line, and the like of the active device are formed using a photolithographic process using an exposing device. However, the photolithographic process includes a series of processes such as a photoresist deposition, an alignment process, an exposure process, a developing process, a cleaning process, and the like.

Also, the photolithographic process must be repeated several times to form patterns of the liquid crystal display device, thereby lowering productivity.

SUMMARY OF THE INVENTION

Accordingly, the present invention is directed to a printing method for forming a pattern that substantially obviates one or more of the problems due to limitations and disadvantages of the related art.

Therefore, an advantage of the present invention is to provide a printing method for forming a pattern capable of improving productivity by forming patterns using a single process.

Another advantage of the present invention is to provide a method for forming a pattern uniform thickness.

Additional features and advantages of the invention will be set forth in the description which follows, and in part will be apparent from the description, or my be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided A method for forming a pattern in a display device, comprising: providing a cliché having a plurality of convex patterns; applying an adhesive force reinforcing agent onto each surface of the plurality of convex patterns; forming an etching object layer on a substrate and then applying ink onto the etching object layer; attaching the cliché and the substrate to each other such that the convex patterns onto which the adhesive force reinforcing agent is applied contact the ink applied to the etching object layer; and forming ink patterns which selectively remain on the etching object layer by separating the substrate and the cliché from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Reference will now be made in detail to embodiments of the present invention, examples of which are illustrated in the accompanying drawings.

The present invention provides a printing method for forming a pattern for an active device of a display device like a liquid crystal display device. In particular, the present invention provides a gravure offset printing method in which ink is put on a concave plate, redundant ink is removed by scraping, and then printing is performed.

In gravure offset printing, since ink is transferred to a substrate using a transfer roller, the pattern can be formed with a single transfer even in display devices having large display areas because the transfer roller used corresponds to the area of the desired display device. Gravure offset printing can be used to form various patterns for the display device such as a gate line and a data line connecting with a TFT, a pixel electrode, a metal pattern for a capacitor as well as the TFT, which constitute a liquid crystal display device.

Figure 1:
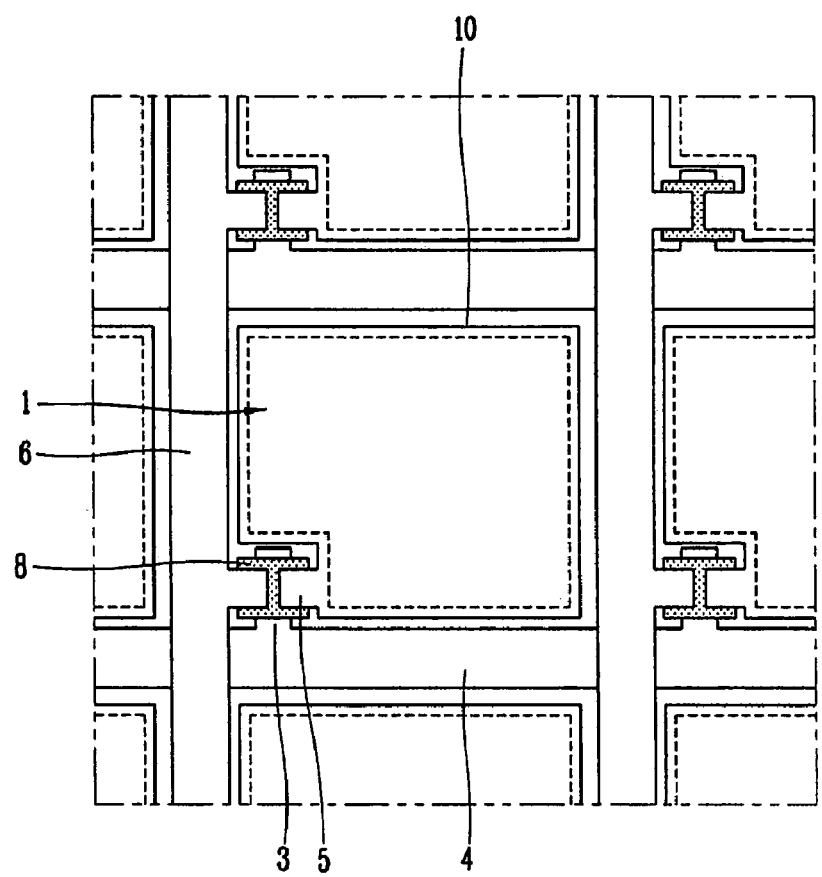
FIG. 1 is a plane view illustrating a structure of a typical liquid crystal display device.
Figure 2:
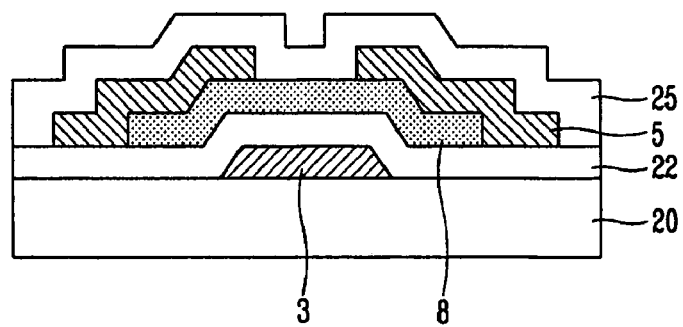
FIG. 2 is a cross-sectional diagram illustrating a structure of a thin film transistor of the liquid crystal display device illustrated in FIG. 1.
Figure 3A:
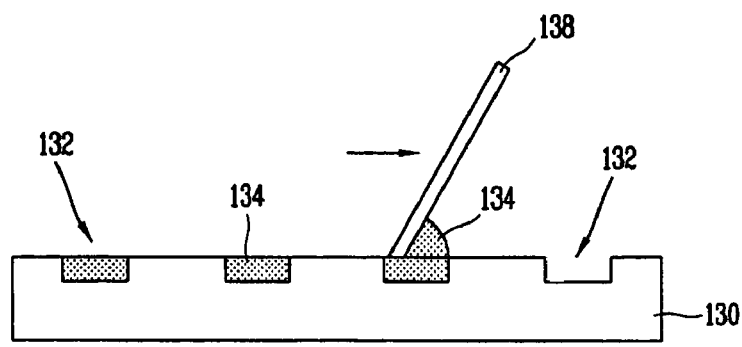
FIGS. 3A to 3C are views illustrating a gravure offset printing method for forming a pattern.
Figure 3B:
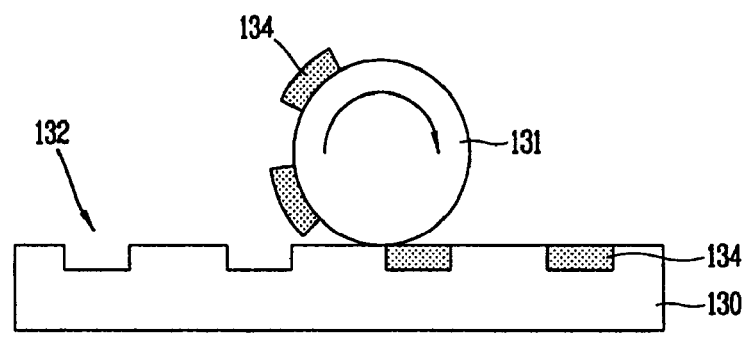
Figure 3C:
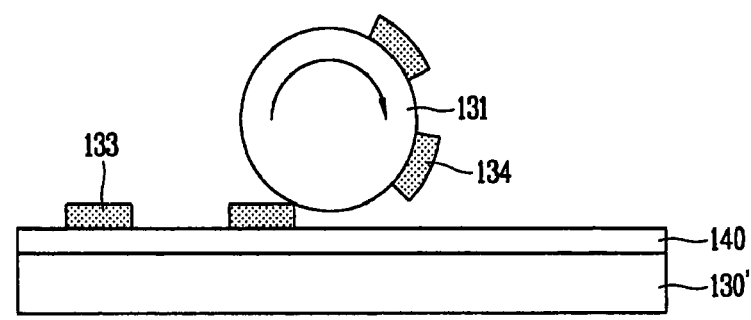

FIGS. 3A to 3C are views illustrating a printing method for forming ink patterns on a substrate. As illustrated in FIG. 3A, after grooves 132 are formed at specific positions on a concave plate or a cliché 130, the grooves 132 are filled ink 134. The grooves 132 formed on the cliché 130 are formed by a photolithographic method. The ink 134 is filled in the grooves 132 by applying the ink 134 onto the cliché 130 and then pushing a blade 138 across the surface of the cliché 130. Thus, as the blade 138 is pushed, the ink 134 is filled in the grooves 132 and at the same time the ink 130 remaining at the surface of the cliché 130 is removed.

As illustrated in FIG. 3B, the ink 134 filled in the grooves 132 is transferred onto a surface of a printing roller 131 as the roller is rotated across the surface of the cliché 130. The printing roller 131 is formed to have the same width as the desired display panel to be fabricated, and has a circumference equal to a length of the panel. Accordingly, the ink 134 is transferred onto the printing roller 33 in a single pass across the cliché.

Thereafter, as illustrated in FIG. 3C, the ink 134 transferred to the printing roller 131 is transferred onto an etching object layer 140 as the printing roller 131 is rotated across the surface of the etching object layer 140 formed on a substrate 130'. The transferred ink 134 is dried by UV-irradiation or heat to form ink patterns 133. The desired patterns 133 are formed on the etching object layer 140 of the display device in a single rotation of the printing roller 131. Subsequently, the etching object layer 140 is etched using the ink patterns 133 as a mask to form the desired patterns.

In the aforementioned printing method, the cliché 130 and the printing roller 131 are fabricated according to the size of a desired display device, such that the desired pattern can be transferred to the substrate 130' in a single pass of the printing roller 131.

The etching object layer 140 may be a metal layer for forming a gate electrode, a source/drain electrode, a gate line, a data line of a TFT, or a pixel electrode, a semiconductor layer for forming an active layer, or an insulating layer such as SiOx or SiNx.

The ink pattern 133 serves as a resist in the conventional photolithographic process. Accordingly, the ink pattern 133 is formed on a metal layer or an insulating layer, and then the metal layer or the insulating layer is etched by a general etching process, thereby forming a metal layer of a desired pattern (for example, an electrode structure) or an insulating layer of a desired pattern (for example, a contact hole, etc.).

The above described printing method has many advantages. In particular, the printing method has a typical advantage that ink patterns are formed on a large area display unit with a single process or processes which are very simple in comparison to the photolithographic processes of the related art.

As the size of the printing roller increases, the likelihood of a non-uniform pressure being applied to the substrate when the ink pattern is transferred from the surface of the printing roller increases. Accordingly, the ink pattern formed on the substrate may have a non-uniform thickness.

To solve the problem, a method for forming a pattern on a substrate without using a printing roller is provided. Accordingly, to this embodiment of the invention ink is applied directly on the substrate and then partially removed using a cliché, such the remaining ink provides the desired pattern, as illustrated in FIGS. 4A to 4G and FIGS. 5A to 5G.

Figure 4A:
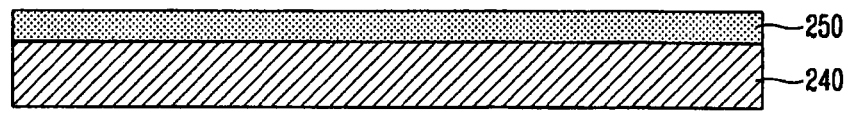
FIGS. 4A to 4G are views illustrating a method for forming a pattern in accordance with an embodiment of the present invention.
Figure 5A:
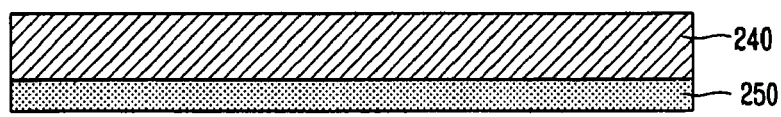
FIGS. 5A to 5G are views illustrating a method for forming a pattern in accordance with the another embodiment of the present invention.

According to this embodiment of the invention, a ink 250 is applied to the entire surface of a substrate 240, as illustrated in FIG. 4A and FIG. 5A. The substrate 240 includes an etching object layer, and the ink 250 is applied onto the etching object layer.

Figure 4B:
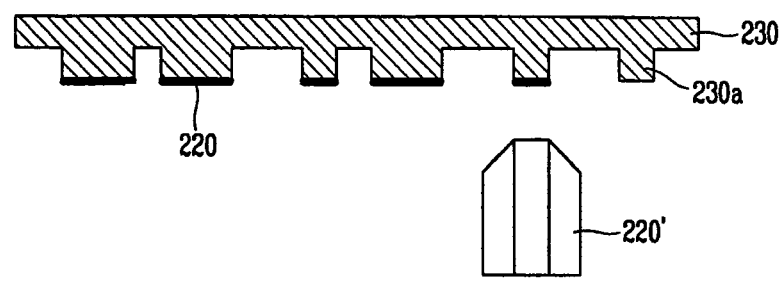
Figure 5B:
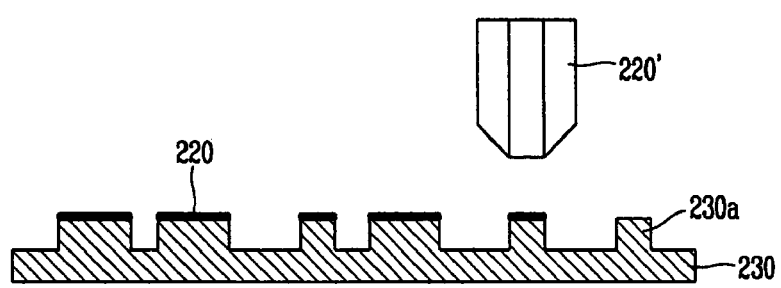

A cliché 230 having a plurality of convex patterns 230a is formed, for example, from a transparent glass substrate. The cliché may be formed by depositing a metal layer on a glass substrate, and patterning the metal layer to form a metal pattern. Then, the glass substrate is etched using the metal pattern as a mask to form convex patterns as illustrated in FIG. 4B and FIG. 5B. The cliché 230, having a plurality of convex patterns 230a is prepared, and then an adhesion force intensifier 220, for example, Hexa Methyl Disilazane (HMDS), is applied to the surface of the convex pattern 230a using an adhesion force intensifying applicator 220'.

Figure 4C:
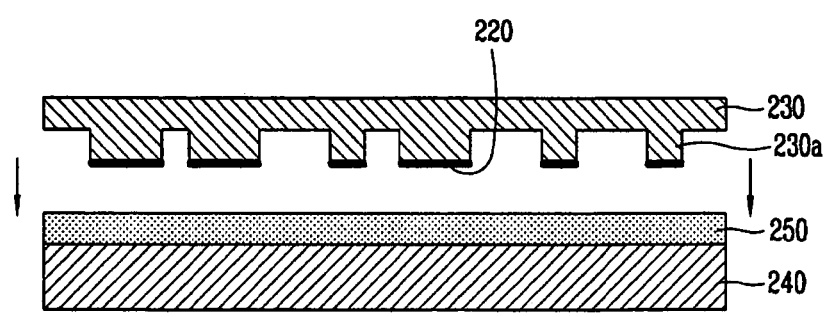
Figure 4D:
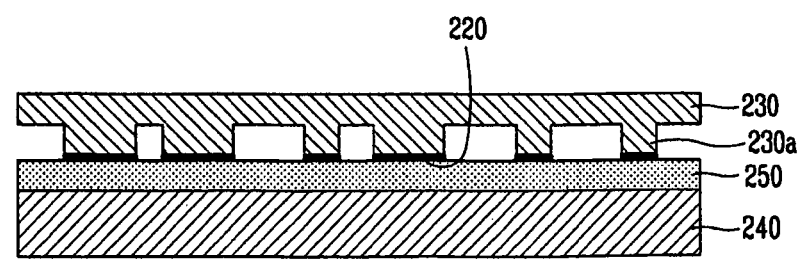

As illustrated in FIG. 4C, an ink layer 250 applied onto the substrate 240 is arranged to face the convex patterns 230a of the cliché 230. The substrate 240 is positioned at a lower side and the cliché 230 is positioned at an upper side. Then, the cliché 230 is moved downward and applied with uniform pressure so that the convex patterns 230a of the cliché 230 come into contact with the ink layer 250.

Figure 5C:
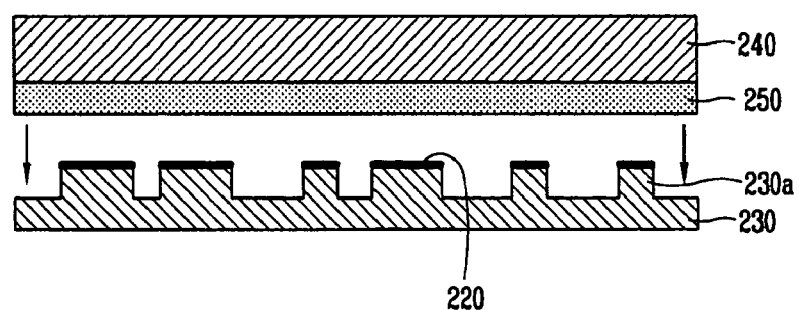
Figure 5D:
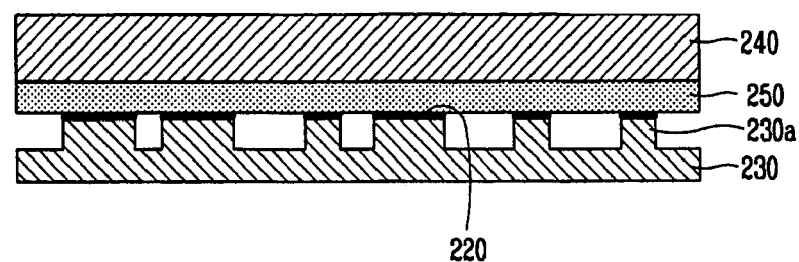

As illustrated in FIG. 5C, it is also possible to position the substrate 240 at an upper side and to position the cliché 230 at a lower side. In this case, the substrate 240 is moved downward to contact the ink layer 250 of the substrate 240 to the convex patterns 230a of the cliché 230.

Figure 4E:
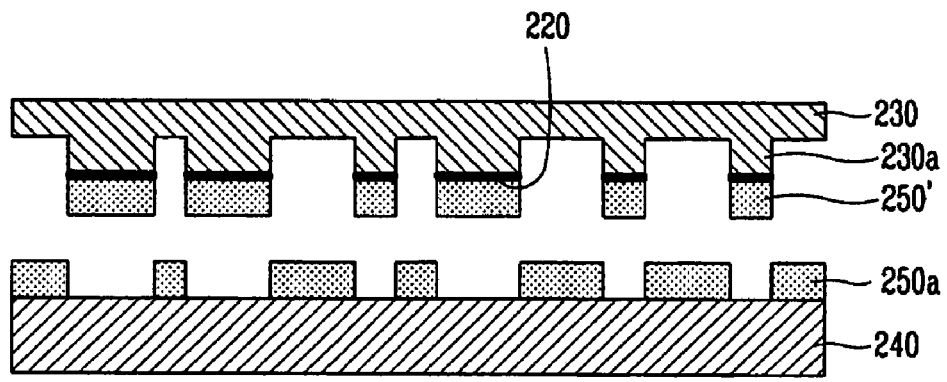
Figure 5E:
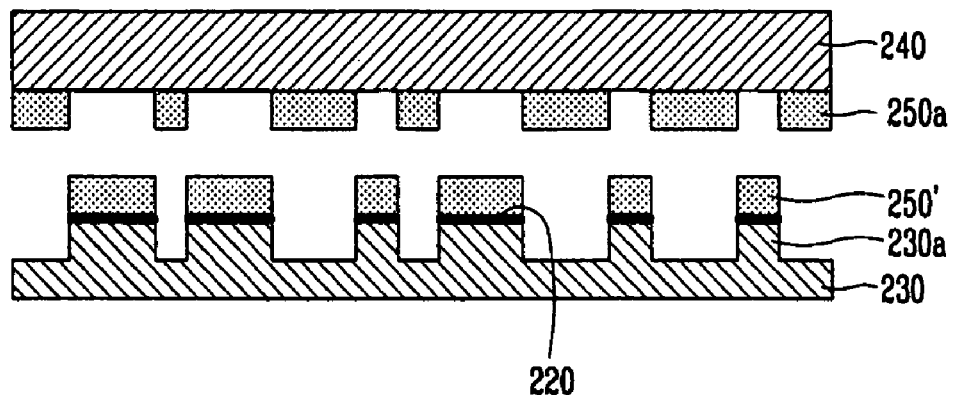

As illustrated in FIG. 4E, when the cliché 230 is detached from the substrate 240, or the substrate 240 is detached from the cliché, as illustrated in FIG. 5E, the ink 250' in the regions that are in contact with the convex patterns 230a is attached to the surfaces of the convex patterns 230a and therefore removed from the substrate 240. Accordingly, an ink pattern 250a is formed on the substrate 240, and the ink pattern 250a remains at a region that is not in contact with the convex patterns 230a of the cliché 230. The adhesion force intensifier 220 applied to the surfaces of the convex patterns 230a enhances the adhesion force between the cliché and the ink such that it is greater than the is adhesion force between the ink and the substrate 240. As a result, the ink 250' contacting the cliché 230 is easily removed from the substrate 240. Accordingly, ink in a region that is in contact with the convex patterns 230a of the cliché 230 is removed, and the ink pattern 250a is formed at a region that is not in contact with the convex patterns 230a. Accordingly, the convex patterns 230a of the cliché 230 have the same shape as the rest region except pattern regions to be formed on the substrate 240.

Figure 4F:
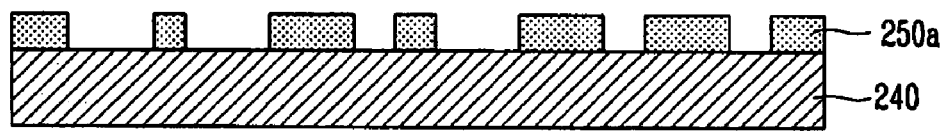
Figure 5F:
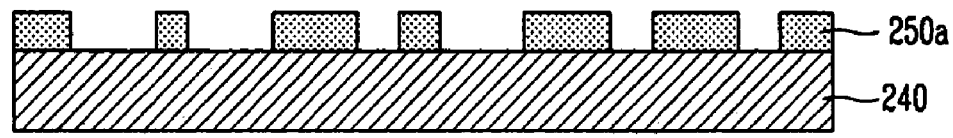

FIG. 4F and FIG. 5F illustrates the ink pattern 250a formed on the substrate 240. An etching object layer of the substrate is etched by using the ink pattern 250a as a mask to form a desired device pattern. Before using the ink pattern 250a as a mask, the pattern is harden by applying heat or irradiating with ultraviolet rays.

The etching object layer may be a metal layer for forming a gate electrode, a source/drain electrode, a gate line, a data line of a TFT, or a pixel electrode, a semiconductor layer for forming an active layer, or an insulating layer such as SiOx or SiNx. When forming a pattern of a display device, the ink pattern 250a serves as a resist in the conventional photolithographic process. Accordingly, the ink pattern 250a is formed on a metal layer or an insulating layer, and then the metal layer or the insulating layer is etched by a general etching process using the ink pattern 250a as a mask, thereby forming a metal layer of a desired pattern (fore example, an electrode structure) or an insulating layer of a desired pattern (for example, a contact hole).

Figure 4G:
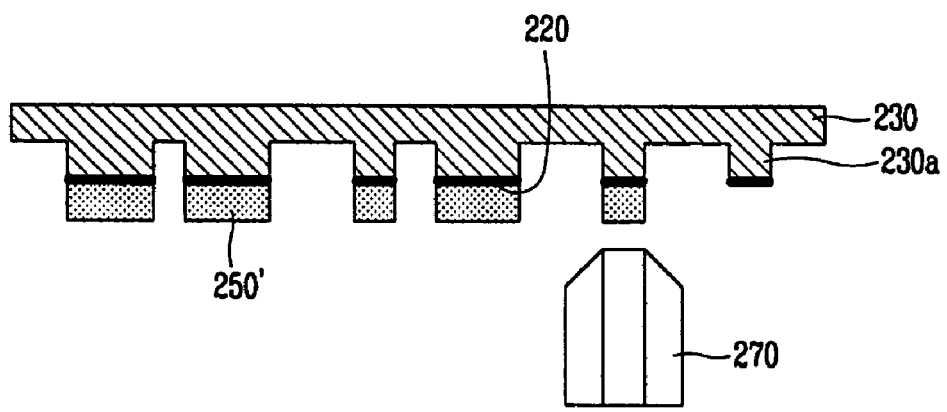
Figure 5G:
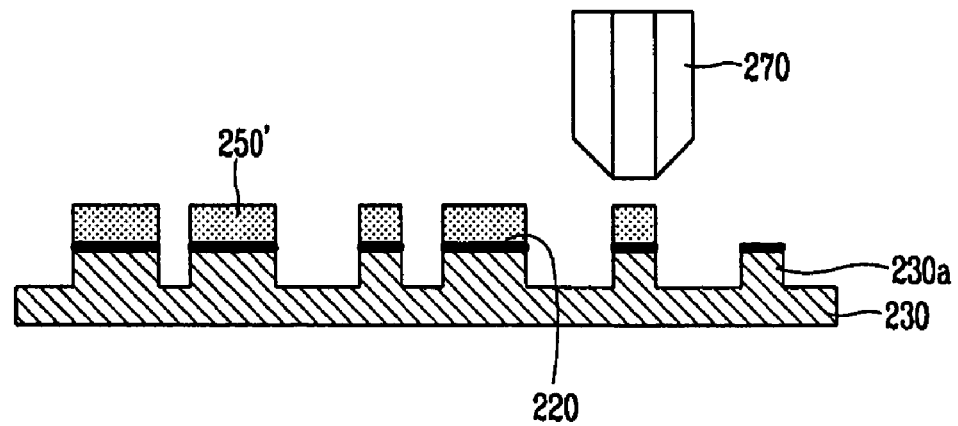

M As illustrated in FIG. 4G and FIG. 5G, the ink 250' and the adhesion force intensifier 220 applied to the surfaces of the convex patterns 230a of the cliché 230 can be removed from the cliché with a cleaning device 270. Cleaning solution injected from the cleaning device 270 removes the ink 250' and the adhesion force intensifier 220 applied to the surfaces of the convex patterns 230a. For example, the cleaning solution can be acetone, N-Methyle Pyrolidone (NMP) and the like.

The cleaning device can be a nozzle type which removes ink by spraying a cleaning solution from a nozzle. In addition, though not illustrated in the drawings, a roller type cleaner may be used. With the roller type cleaning device, a material capable of improving an adhesive force with respect to ink is applied onto the surface of a cleaning roller and the cleaning roller is rotated across the cliché thereby transferring the ink from the cliché to the surface of the cleaning roller. Accordingly, the ink applied onto the cliché can be removed.

According to the aforementioned embodiment of the present invention, after ink is applied onto a substrate on which a pattern is formed, the ink in contact with convex patterns is separated from the substrate by contacting a cliché having convex patterns with a surface of the ink with uniform pressure applied thereto, so that ink patterns are formed at regions where they do not contact with the convex patterns.

After ink is pre-applied onto a substrate, a cliché having convex patterns comes in contact with the ink to form printing patterns. In such a case, printing equipment can be simplified because a printing roller is not used, processes are simplified compared to the case where the printing roller is used, and accuracy of patterns can be improved. By simplifying printing equipment and printing processes, production efficiency can be improved.

As described so far, the present invention provides a method for forming a pattern by a printing method, and more particularly, a method for forming a pattern, capable of forming ink patterns having a uniform thickness by using a cliché having convex patterns.

In addition, the method for forming a pattern by a printing method may be used to form a device in a semiconductor substrate as well as an active device or a circuit of a display device such as a liquid crystal display device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming a pattern in a display device, comprising:
   providing a cliché having a plurality of convex patterns;
   applying an adhesive force reinforcing agent onto each surface of the plurality of convex patterns;
   forming an etching object layer on a substrate and then applying ink onto the etching object layer;
   attaching the cliché and the substrate to each other such that the convex patterns onto which the adhesive force reinforcing agent is applied contact the ink applied to the etching object layer; and
   forming ink patterns which selectively remain on the etching object layer by separating the substrate and the cliché from each other.

2. The method of claim 1, wherein providing the cliché having the plurality of convex patterns comprises:
   providing a transparent glass substrate;
   depositing a metal layer over the substrate;
   forming a metal pattern by patterning the metal layer; and
   etching the glass substrate by using the metal pattern as a mask.

3. The method of claim 1, wherein the adhesive force reinforcing agent is HMDS (Hexa Methyl Disilazane).

4. The method of claim 1, wherein attaching the substrate and the cliché to each other comprises:
   disposing the substrate at a lower portion and disposing the cliché at an upper portion.

5. The method of claim 4, wherein separating the substrate and the cliché from each other comprises removing the cliché from the substrate.

6. The method of claim 1, wherein attaching the substrate and the cliché to each other comprises disposing the substrate at an upper portion and the cliché at a lower portion.

7. The method of claim 4, wherein separating the substrate and the cliché from each other comprises removing the substrate from the cliché.

8. The method of claim 1, wherein as the substrate and the cliché are separated from each other, the ink is attached to the convex patterns at a region where the ink contacts with the convex patterns of the cliché, and thus is removed from the etching object layer.

9. The method of claim 1, wherein the ink pattern formed on the etching object layer is formed at regions that are not in contact with the convex patterns of the cliché.

10. The method of claim 1, further comprising:
    hardening the ink patterns.

11. The method of claim 10, wherein the hardening the ink patterns comprises:
    applying heat to the ink patterns.

12. The method of claim 10, wherein the hardening the ink patterns comprises:
    irradiating the ink patterns with ultraviolet rays(UV).

13. The method of claim 1, further comprising:
    etching the etching object layer using the ink patterns as a mask.

* * * * *